US006833221B2

(12) United States Patent
McArthur et al.

(10) Patent No.: US 6,833,221 B2
(45) Date of Patent: Dec. 21, 2004

(54) METHOD AND APPARATUS FOR PROPER ORDERING OF REGISTRATION DATA

(75) Inventors: Bruce McArthur, San Diego, CA (US); Adlai Smith, Escondido, CA (US)

(73) Assignee: Litel Instruments, San Diego, CA (US)

( * ) Notice: Subject to any disclaimer, the term of this patent is extended or adjusted under 35 U.S.C. 154(b) by 178 days.

(21) Appl. No.: 10/039,426

(22) Filed: Jan. 4, 2002

(65) Prior Publication Data

US 2002/0140917 A1 Oct. 3, 2002

Related U.S. Application Data

(60) Provisional application No. 60/259,873, filed on Jan. 5, 2001.

(51) Int. Cl.[7] .......... G03F 9/00

(52) U.S. Cl. .......... 430/5; 430/22; 430/30

(58) Field of Search .......... 430/5, 22, 30

(56) References Cited

U.S. PATENT DOCUMENTS

| | | | | | |
|---|---|---|---|---|---|
| 5,721,619 | A | * | 2/1998 | Hiruma et al. | 430/22 |
| 5,828,455 | A | | 10/1998 | Smith et al. | 356/354 |
| 5,849,441 | A | * | 12/1998 | Nara et al. | 430/22 |
| 5,853,927 | A | * | 12/1998 | Huang | 430/22 |
| 5,978,085 | A | | 11/1999 | Smith et al. | 356/354 |
| 6,022,650 | A | * | 2/2000 | Sogawa | 430/22 |
| 6,143,621 | A | | 11/2000 | Tzeng et al. | 438/401 |
| 6,462,818 | B1 | * | 10/2002 | Bareket | 430/22 |

OTHER PUBLICATIONS

Hasan et al., "Automated Electrical Measurements of Registration Errors in Step–and–Repeat Optical Lithography Systems", *IEEE Transactions on Electron Devices,* ED27(12):2304–2312 (1980).

KLA 5105, "Linewidth and Misregistration System", KLA 5105 Product Specification, *KLA Instruments Corporation,* 2 pages (1995).

KLA 5200, "Value–added Overlay Metrology for Advanced Lithography", KLA 5200 Product Specifications, *KLA Instruments Corporation,* 2 pages, (1996).

Kodama et al., "Measuring System XY–5i", *SPIE, 2439*:144–155 (1995).

McFadden et al., "A Computer Aided Engineering Workstation for Registration Control", *SPIE, 1087*:255–266 (1989).

Pellegrini et al., "Super Sparse Overlay Sampling Plans: An Evaluation of Methods and Algorithms for Optimizing Overlay Quality Control and Metrology Tool Throughput", *SPIE, 3677*:72–82 (1999).

Preil et al., "A New Approach to Correlating Overlay and Yield", *SPIE, 3677*:208–216 (1999).

Sullivan, N.T., "Semiconductor Pattern Overlay", *SPIE Critical Reviews of Optical Science and Technology, CR52*:160–188 (1994).

van den Brink et al., "Direct–Refreshing Automatic Two–Points Reticle–to–Wafer Alignment Using a Projection Column Servo System", *SPIE, 633*:60–71 (1986).

van den Brink et al., "Matching of Multiple Wafer Steppers for 0.35 μm Lithography Using Advanced Optimization Schemes", *SPIE, 1926*:188–207 (1993).

* cited by examiner

*Primary Examiner*—Christopher G. Young

(57) ABSTRACT

A photomask or reticle including a unique set of alignment attributes at separate and distinguishable field points is put in the reticle plane of a photolithographic projection system. The reticle pattern is exposed onto a resist coated wafer or substrate and processed through the final few steps of the photolithographic process. The resulting array of alignment attributes are then measured using a standard optical overlay metrology tool. The overlay tool is driven by a set of software instructions. By comparing the resulting overlay data to the placement error encoded on the reticle it can determined if the data has been read or displayed in the correct order.

35 Claims, 16 Drawing Sheets

| | 1 | 4 | 5 | 6 | 7 | 8 | 9 | 10 | 11 | 12 | 13 | 14 | 15 | 16 | 17 | 18 | 21 |
|---|---|---|---|---|---|---|---|---|---|---|---|---|---|---|---|---|---|
| 21<br>21 | | | | | | | | | | | | | | | | | |
| 18<br>18 | | BBx<br>BBy | | | | | 0.313<br>-0.1875 | 0.250<br>-0.1875 | 0.188<br>-0.1875 | 0.125<br>-0.1875 | 0.063<br>-0.1875 | | | | | | |
| 17<br>17 | | | | | 0.438<br>-0.125 | 0.375<br>-0.125 | 0.313<br>-0.125 | 0.250<br>-0.125 | 0.188<br>-0.125 | 0.125<br>-0.125 | 0.063<br>-0.125 | 0.000<br>-0.125 | -0.063<br>-0.125 | | | | |
| 16<br>16 | | | | 0.500<br>-0.0625 | 0.438<br>-0.0625 | 0.375<br>-0.0625 | 0.313<br>-0.0625 | 0.250<br>-0.0625 | 0.188<br>-0.0625 | 0.125<br>-0.0625 | 0.063<br>-0.0625 | 0.000<br>-0.0625 | -0.063<br>-0.0625 | -0.125<br>-0.0625 | | | |
| 15<br>15 | | | 0.563<br>0 | 0.500<br>0 | 0.438<br>0 | 0.375<br>0 | 0.313<br>0 | 0.250<br>0 | 0.188<br>0 | 0.125<br>0 | | | -0.063<br>0 | -0.125<br>0 | -0.188<br>0 | | |
| 14<br>14 | | | 0.563<br>0.0625 | 0.500<br>0.0625 | 0.438<br>0.0625 | 0.375<br>0.0625 | 0.313<br>0.0625 | 0.250<br>0.0625 | 0.188<br>0.0625 | 0.125<br>0.0625 | 0.063<br>0.0625 | | -0.063<br>0.0625 | -0.125<br>0.0625 | -0.188<br>0.0625 | | |
| 13<br>13 | | 0.625<br>0.125 | 0.563<br>0.125 | 0.500<br>0.125 | 0.438<br>0.125 | 0.375<br>0.125 | 0.313<br>0.125 | 0.250<br>0.125 | 0.188<br>0.125 | 0.125<br>0.125 | 0.063<br>0.125 | 0.000<br>0.125 | -0.063<br>0.125 | -0.125<br>0.125 | -0.188<br>0.125 | -0.250<br>0.125 | |
| 12<br>12 | | 0.625<br>0.1875 | 0.563<br>0.1875 | 0.500<br>0.1875 | 0.438<br>0.1875 | 0.375<br>0.1875 | 0.313<br>0.1875 | 0.250<br>0.1875 | 0.188<br>0.1875 | 0.125<br>0.1875 | 0.063<br>0.1875 | 0.000<br>0.1875 | -0.063<br>0.1875 | -0.125<br>0.1875 | -0.188<br>0.1875 | -0.250<br>0.1875 | |
| 11<br>11 | | 0.625<br>0.25 | 0.563<br>0.25 | 0.500<br>0.25 | 0.438<br>0.25 | 0.375<br>0.25 | 0.313<br>0.25 | 0.250<br>0.25 | 0.188<br>0.25 | 0.125<br>0.25 | 0.063<br>0.25 | 0.000<br>0.25 | -0.063<br>0.25 | -0.125<br>0.25 | -0.188<br>0.25 | -0.250<br>0.25 | |
| 10<br>10 | | 0.625<br>0.3125 | 0.563<br>0.3125 | | 0.438<br>0.3125 | 0.375<br>0.3125 | 0.313<br>0.3125 | 0.250<br>0.3125 | 0.188<br>0.3125 | 0.125<br>0.3125 | 0.063<br>0.3125 | 0.000<br>0.3125 | -0.063<br>0.3125 | -0.125<br>0.3125 | -0.188<br>0.3125 | -0.250<br>0.3125 | |
| 9<br>9 | | 0.625<br>0.375 | 0.563<br>0.375 | | 0.438<br>0.375 | 0.375<br>0.375 | 0.313<br>0.375 | 0.250<br>0.375 | 0.188<br>0.375 | 0.125<br>0.375 | 0.063<br>0.375 | 0.000<br>0.375 | -0.063<br>0.375 | -0.125<br>0.375 | -0.188<br>0.375 | -0.250<br>0.375 | |
| 8<br>8 | | | 0.563<br>0.4375 | 0.500<br>0.4375 | 0.438<br>0.4375 | 0.375<br>0.4375 | 0.313<br>0.4375 | 0.250<br>0.4375 | 0.188<br>0.4375 | 0.125<br>0.4375 | 0.063<br>0.4375 | 0.000<br>0.4375 | -0.063<br>0.4375 | -0.125<br>0.4375 | -0.188<br>0.4375 | | |
| 7<br>7 | | | 0.563<br>0.5 | 0.500<br>0.5 | 0.438<br>0.5 | 0.375<br>0.5 | 0.313<br>0.5 | 0.250<br>0.5 | 0.188<br>0.5 | 0.125<br>0.5 | 0.063<br>0.5 | 0.000<br>0.5 | -0.063<br>0.5 | -0.125<br>0.5 | -0.188<br>0.5 | | |
| 6<br>6 | | | | 0.500<br>0.5625 | 0.438<br>0.5625 | 0.375<br>0.5625 | 0.313<br>0.5625 | 0.250<br>0.5625 | 0.188<br>0.5625 | 0.125<br>0.5625 | 0.063<br>0.5625 | 0.000<br>0.5625 | -0.063<br>0.5625 | -0.125<br>0.5625 | | | |
| 5<br>5 | | | | | 0.438<br>0.625 | 0.375<br>0.625 | 0.313<br>0.625 | 0.250<br>0.625 | 0.188<br>0.625 | 0.125<br>0.625 | 0.063<br>0.625 | 0.000<br>0.625 | -0.063<br>0.625 | | | | |
| 4<br>4 | | | | | | | 0.313<br>0.6875 | 0.250<br>0.6875 | 0.188<br>0.6875 | 0.125<br>0.6875 | 0.063<br>0.6875 | | | | | | |
| 1<br>1 | | | | | | | | | | | | | | | | | |

*FP = 98*
*IX_0 = 14*
*IY_0 = 15*
*DS/DSQ_W = 0.0625*

*FIG. 7*

IX0=position within 21 x 21 array where (BBx,BBy)=(0,0) occurs
IY0
FP=field point number IY=Row

| | | | | | | | | | | |
|---|---|---|---|---|---|---|---|---|---|---|
| 12 | 7<br>17<br>111 | 8<br>17<br>112 | 9<br>17<br>113 | 10<br>17<br>114 | 11<br>17<br>115 | 12<br>17<br>116 | 13<br>17<br>117 | 14<br>17<br>118 | 15<br>17<br>119 | 16<br>17<br>120 |
| 11 | 7<br>16<br>101 | 8<br>16<br>102 | 9<br>16<br>103 | 10<br>16<br>104 | 11<br>16<br>105 | 12<br>16<br>106 | 13<br>16<br>107 | 14<br>16<br>108 | 15<br>16<br>109 | 16<br>16<br>110 |
| 10 | 7<br>15<br>91 | 8<br>15<br>92 | 9<br>15<br>93 | 10<br>15<br>94 | 11<br>15<br>95 | 12<br>15<br>96 | 13<br>15<br>97 | 14<br>15<br>98 | 15<br>15<br>99 | 16<br>15<br>100 |
| 9 | 7<br>14<br>81 | 8<br>14<br>82 | 9<br>14<br>83 | 10<br>14<br>84 | 11<br>14<br>85 | 12<br>14<br>86 | 13<br>14<br>87 | 14<br>14<br>88 | 15<br>14<br>89 | 16<br>14<br>90 |
| 8 | 7<br>13<br>71 | 8<br>13<br>72 | 9<br>13<br>73 | 10<br>13<br>74 | 11<br>13<br>75 | 12<br>13<br>76 | 13<br>13<br>77 | 14<br>13<br>78 | 15<br>13<br>79 | 16<br>13<br>80 |
| 7 | 7<br>12<br>61 | 8<br>12<br>62 | 9<br>12<br>63 | 10<br>12<br>64 | 11<br>12<br>65 | 12<br>12<br>66 | 13<br>12<br>67 | 14<br>12<br>68 | 15<br>12<br>69 | 16<br>12<br>70 |
| 6 | 7<br>11<br>51 | 8<br>11<br>52 | 9<br>11<br>53 | 10<br>11<br>54 | 11<br>11<br>55 | 12<br>11<br>56 | 13<br>11<br>57 | 14<br>11<br>58 | 15<br>11<br>59 | 16<br>11<br>60 |
| 5 | 7<br>10<br>41 | 8<br>10<br>42 | 9<br>10<br>43 | 10<br>10<br>44 | 11<br>10<br>45 | 12<br>10<br>46 | 13<br>10<br>47 | 14<br>10<br>48 | 15<br>10<br>49 | 16<br>10<br>50 |
| 4 | 7<br>9<br>31 | 8<br>9<br>32 | 9<br>9<br>33 | 10<br>9<br>34 | 11<br>9<br>35 | 12<br>9<br>36 | 13<br>9<br>37 | 14<br>9<br>38 | 15<br>9<br>39 | 16<br>9<br>40 |
| 3 | 7<br>8<br>21 | 8<br>8<br>22 | 9<br>8<br>23 | 10<br>8<br>24 | 11<br>8<br>25 | 12<br>8<br>26 | 13<br>8<br>27 | 14<br>8<br>28 | 15<br>8<br>29 | 16<br>8<br>30 |
| 2 | 7<br>7<br>11 | 8<br>7<br>12 | 9<br>7<br>13 | 10<br>7<br>14 | 11<br>7<br>15 | 12<br>7<br>16 | 13<br>7<br>17 | 14<br>7<br>18 | 15<br>7<br>19 | 16<br>7<br>20 |
| 1 | 7<br>6<br>1 | 8<br>6<br>2 | 9<br>6<br>3 | 10<br>6<br>4 | 11<br>6<br>5 | 12<br>6<br>6 | 13<br>6<br>7 | 14<br>6<br>8 | 15<br>6<br>9 | 16<br>6<br>10 |
| | 1 | 2 | 3 | 4 | 5 | 6 | 7 | 8 | 9 | 10 IX=Col |

FIG. 8

METHOD AND APPARATUS FOR PROPER ORDERING OF REGISTRATION DATA

REFERENCE TO PRIORITY DOCUMENT

This Application claims priority to pending U.S. Provisional Application Ser. No. 60/259,873 filed Jan. 5, 2001, entitled "METHOD AND APPARATUS FOR PROPER ORDERING OF REGISTRATION DATA" by Adlai Smith, and Bruce McArthur, which is incorporated by reference in its entirety herein.

BACKGROUND OF THE INVENTION

1. Field of the Invention

The present invention relates generally to processes for semiconductor metrology and more particularly to verification of measured metrology data.

2. Description of Related Art

A typical microelectronic device or circuit may consist of twenty to thirty levels, or pattern layers. The placement of particular features on any level need to match the placement of corresponding features on other levels, i.e. there must be overlap, within an accuracy that is some fraction of the minimum feature size or a critical dimension (CD).

Overlay registration is a translational error that exists between features exposed layer to layer in the vertical manufacturing process of semiconductor devices on silicon wafers. Other names for overlay registration include, registration error and pattern placement error. The physical sources of these errors are generally distinct; inter-field errors are generally due to imaging objective aberrations or possibly scanning dynamics while intra-field errors are usually due to the wafer alignment system and the wafer stage. Typically, in order to measure overlay error using conventional optical metrology tools, special arrays of alignment attributes or overlay targets are printed or imaged onto a properly designed recording media using a photolithographic imaging system. Recording media includes: positive or negative photoresist, optically activated liquid crystals, electronic CCD or diode imaging arrays, optically sensitive recording devices, and photographic film.

FIG. 9 is an illustration of some of the many different kinds of alignment attributes or overlay targets available, including box-in-box 902, frame-in-frame 904, segmented frame-in-frame 906, multi-segmented frame-in-frame 908, phase gratings 910, verniers, and electrical test structures. See Direct-referencing automatic two-points reticle-to-wafer alignment using a projection column servo system, M. Van den Brink, H. Linders, S. Wittekoek, SPIE Vol. 633, Optical Microlithography V, 60:71, 1986; Automated Electrical Measurements of Registration Errors in Step and Repeat Optical Lithography Systems, T. Hasan et al., IEEE Transactions on Electron Devices, Vol. ED-27, No. 12, 2304:2312, December 1980; Capacitor Circuit Structure for Determining Overlay Error, U.S. Pat. No. 6,143,621 to K. Tzeng, et al. Alignment attributes, such as the ones illustrated in FIG. 9, are used with photolithographic overlay tools. See, for example, KLA 5105 overlay brochure, KLA-Tencor; KLA 5200 overlay brochure, KLA-Tencor; Measuring system XY-5i, K. Kodama et al., SPIE Vol. 2439, 144:155, 1995; and Apparatus and Method of Measurement and Method of Data Analysis for Correction of Optical System, U.S. Pat. No. 5,828,955 to Smith et al.

FIG. 5(*a*) shows a typical overlay displacement vector 502 representing the x-shift and y-shift vector overlay error associated with a misaligned frame-in-frame alignment attribute. In some cases the overlay error can be measured using special in-situ exposure tool metrology See Direct-referencing automatic two-points reticle-to-wafer alignment using a projection column servo system, supra. Many commercial software packages exist (see A Computer Aided Engineering Workstation for Registration Control, E. McFadden, C. Ausschnitt, SPIE Vol. 1087, 255:266 1989; Matching of Multiple Wafer Steppers for 0.35 Micron Lithography using Advanced Optimization Schemes, M. van den Brink, et al., SPIE Vol. 1926, 189:207, 1993, (hereinafter Klass II)) that model and statistically determine the relative magnitude of the systematic and random inter-field and intra-field error components for the purpose of process control, projection lens adjustment, wafer stage calibration, and exposure tool set-up. Other methods such as described in U.S. Pat. No. 5,978,085 and U.S. Pat. No. 5,828,455 both entitled "APPARATUS, METHOD OF MEASUREMENT, AND METHOD OF DATA ANALYSIS FOR CORRECTION OF OPTICAL SYSTEM" to Adlai Smith, Bruce McArthur, and Robert Hunter, and both incorporated in their entirety herein, use overlay techniques to determine the lens aberrations of the photolithographic exposure tool or machine.

Over the past thirty years the microelectronics industry has experienced dramatic rapid decreases in critical dimension by constantly improving photolithographic imaging systems. Today, these photolithographic systems are pushed to performance limits. As the semiconductor industry rapidly approaches limits of optical lithography new metrology techniques will be needed to measure the integrity of the photolithographic exposure machines and the devices they help produce. Specifically, metrology techniques that can accurately determine the aberrations of the projection system as well as the alignment precision of the exposure machines will be a necessity. In addition, these new metrology techniques will require advances in the methods used to guarantee the integrity of the data.

For some applications, such as very high rate overlay sampling on semiconductor production wafers, overlay registration results are not that sensitive to the exact sampling in terms of target position and other parameters. For example, a typical semiconductor manufacturing facility might, for purposes of process control, monitor the day to day alignment accuracy of an photolithographic tool by measuring a small number of overlay targets on a small group of production wafers, see for example FIGS. 14(*a*), 14(*b*), 14(*c*) and 15(*b*). See Semiconductor Pattern Overlay, N. Sullivan, SPIE Critical Reviews Vol. CR52, 160:188; Super Sparse Overlay Sampling Plans: An Evaluation of Methods and Algorithms for Optimizing Overlay Quality Control and Metrology Tool Throughput, J. Pellegrini, SPIE Vol. 3677, 72:82, 36220.

Typically, a sampling plan may involve measuring approximately twenty alignment attributes on each wafer and calculating the statistical distribution of overlay error associated with each group of wafers. Also, overlay variations from wafer to wafer over time can be observed to ascertain process stability. Generally, it is possible to determine significant changes in the performance of the photolithographic alignment process even when some of the overlay data is missing or parsed in the wrong order. This is mainly due to the statistical methods that are used to calculate the magnitude and direction of the spatially dependent components of overlay error See A New Approach to Correlating Overlay and Yield, M. Preil, J. McCormack, SPIE Conference on Metrology, Inspection, and Process Control for Microlithography XIII, 208:216, March 1999; Semiconductor Pattern Overlay, supra.

However, in interferometric applications the reconstruction of the lens aberrations depends in large part on the proper reading and sequencing of large volumes of overlay data. Although in principle it should not be difficult to program an overlay tool to read alignment attributes in the correct order, there are a few programming and machine limitations that make the task difficult in practice. For example, the programming of optical overlay tools is usually sensitive to many parameters, such as desired measurement spacing, the alignment attribute size, the field point desired, and the spatial density of alignment attributes. This may be further aggravated by the fact that the reconstructed wavefront does not lend itself to an intuitive understanding of what the local overlay should look like. In addition, some overlay tools do not print or report the output using a simple coding system, making it difficult to debug the program.

In general, most overlay tools have no way of independently verifying if the overlay job deck has been programmed correctly or if the overlay tool is measuring correctly. Thus, to provide an independent verification of the program and operation of overlay tools for applications sensitive to such kinds of errors, a simple means of independently determining the programming and functioning of the overlay tool is desirable. In addition, it would be advantageous if the results of the verification are unambiguous and can be used to debug and monitor the overlay tool and/or its programming.

SUMMARY OF THE INVENTION

In accordance with the invention, an apparatus and method to monitor the overlay error and verify the pattern data flow fidelity is described. A photomask, or reticle, containing groups of strategically positioned alignment attributes in a pattern with known deviations is loaded into a photolithographic exposure tool or machine and exposed, or imaged, onto a recording media comprising a photoresist coated wafer. The wafer is sent through a photolithographic process to delineate or develop out the exposure pattern into the resist or etched substrate. Next, the wafer is sent to an overlay tool for measurement. It may then be determined whether the overlay tool measured the exposed alignment attribute pattern in a correct order by identifying the locations of the deviations within the measured pattern and comparing those locations to the reticle pattern with known deviations. If the patterns do not align, then an overlay job deck program or code used to control the overlay machine may be debugged to perform the measurements in the desired order.

In general, overlay patterns are a product of the initially encoded set-up reticle pattern and the effect of the lens, developing, and/or etch processes used to produce the final overlay target patterns. In addition, the overlay tool may corrupt the output data because of various tool errors or inconsistencies, including repeated or missing data, inaccurate reporting, and position dependent biases. In accordance with the invention, a method and apparatus can be used to determine both the integrity of the overlay job deck and the quality of the overlay data with respect to order and accuracy.

BRIEF DESCRIPTION OF THE DRAWINGS

The features of this invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction the accompanying drawings in which:

FIG. 1(*b*) is a side view of the reticle of FIG. 1(*a*).

FIG. 1(*c*) is a schematic diagram showing additional detail of a field point on the reticle of FIG. 1(*a*).

FIG. 1(*d*) is a schematic diagram showing a typical wafer level exposure pattern.

FIG. 1(*e*) is a schematic diagram showing additional detail of a field point of the exposure pattern of FIG. 1(*d*).

FIG. 2(*b*) is a schematic diagram showing additional detail of a field point of the reticle of FIG. 2(*a*).

FIG. 4(*b*) is a schematic diagram showing a field point coordinate array diagram (IFXP, IFYP).

FIGS. 5(*b*1)–5(*b*4) are a schematic diagram showing typical overlay errors associated with prior art systems.

FIG. 5(*c*) is a schematic diagram showing measured zero offset in the presence of CD variation.

FIG. 5(*d*) is a schematic diagram showing measured non-zero offset in the presence of CD variation.

FIG. 7 is a graphical illustration listing detailed numeric values of offsets within a field point array.

FIG. 8 is a table listing the locations of the center frame-in-frame structure on an exemplar of a setup reticle as function of field point.

FIG. 15(*b*) is a flow chart of a prior art production use of overlay.

FIG. 15(*c*) is a flow chart of a prior art lens aberration measurement.

DETAILED DESCRIPTION

Figure 1B:
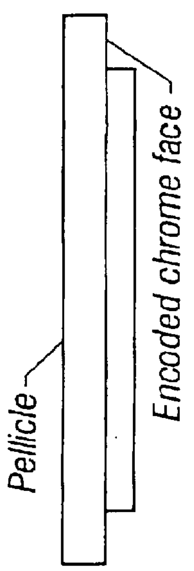
FIG. 1(*a*) is a schematic diagram×6" reticle constructed in accordance with the invention.
Figure 1C:
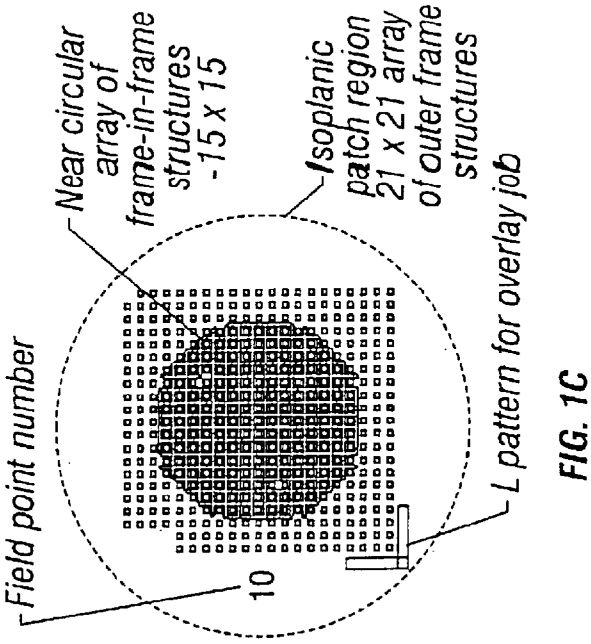
Figure 1A:
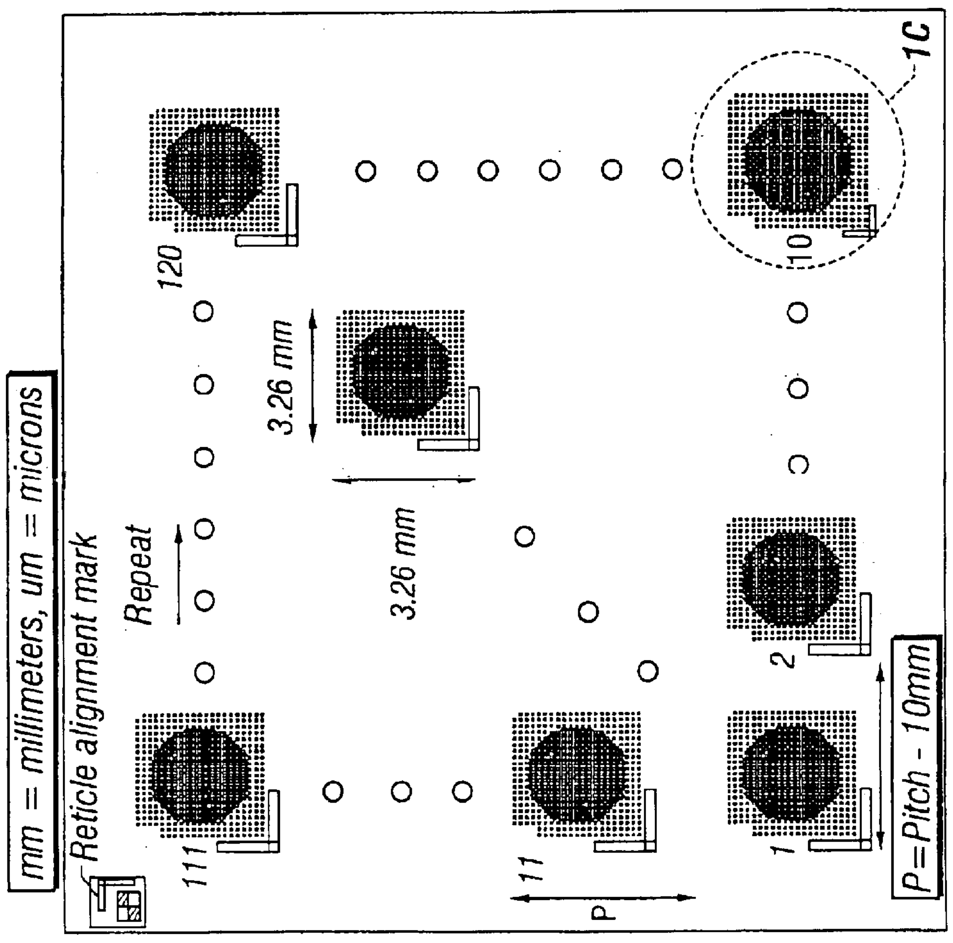
Figure 1D:
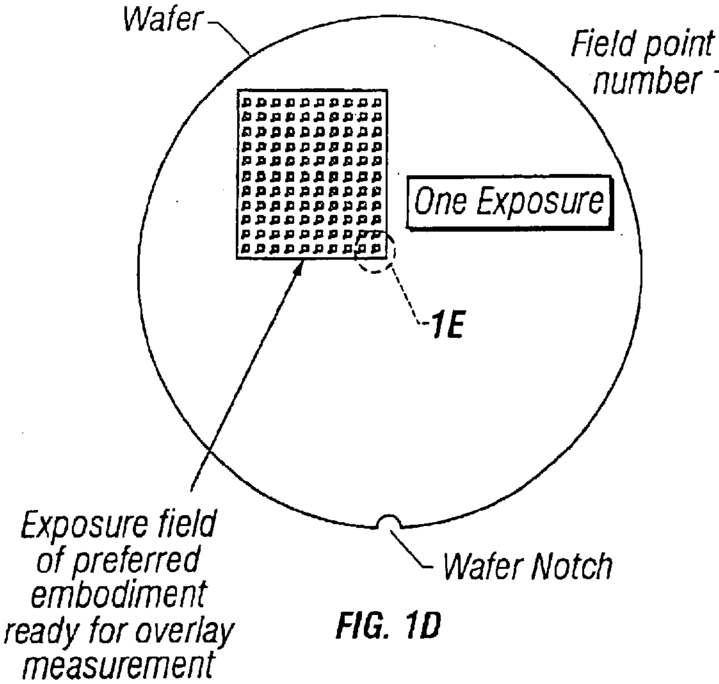
Figure 1E:
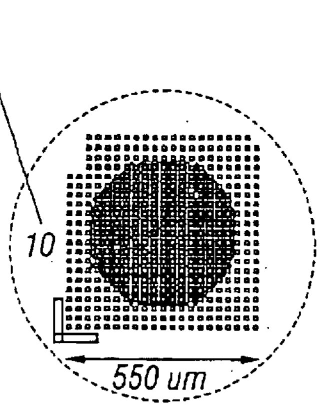
Figure 2A:
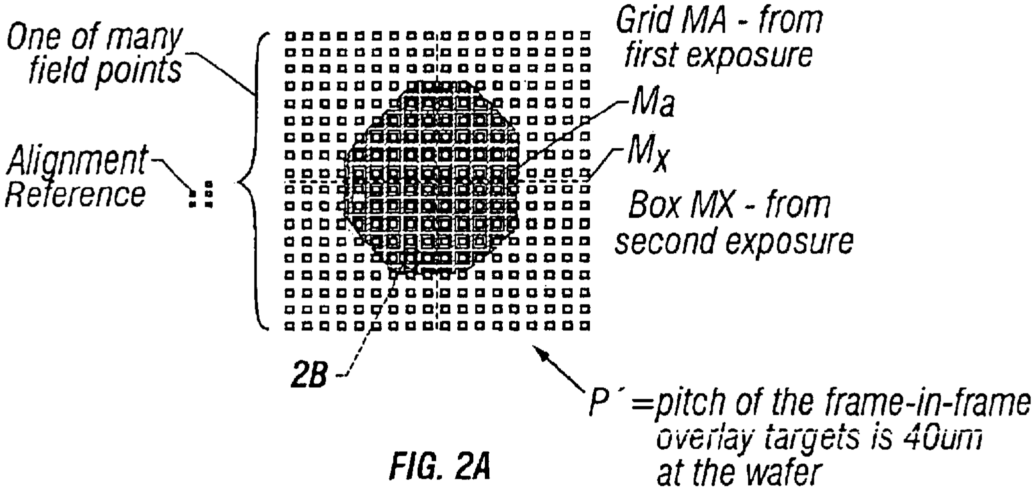
FIG. 2(*a*) is a schematic diagram of two exposures of a prior art ISI reticle.
Figure 2B:
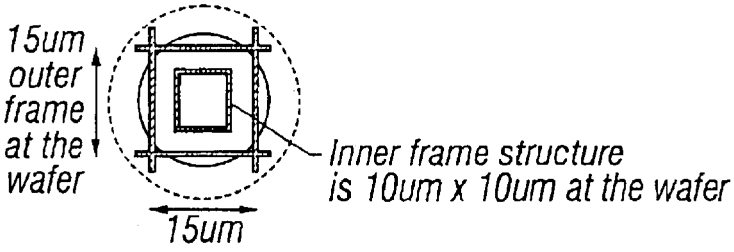

Over the past few years, semiconductor manufactures have continued to produce smaller more powerful devices for reduced costs. As the critical dimensions of these devices continue to shrink towards atomic dimensions the lithographic machines that produce them are often forced to operate near the design limit. The ability to accurately determine the performance and limitations of the lithographic machines is paramount in the development of new, robust and economically viable manufacturing processes. In order to accomplish this task, semiconductor manufacturing facilities use registration or overlay metrology techniques to both qualify and monitor the lithographic exposure tools and processes. The overlay metrology tools are programmed via a job deck that contains the machine instructions for measuring the alignment attributes in a certain order. A technique that makes use of a specially encoded set-up reticle to independently verify if the overlay tool has been programmed to read the data in the correct order is described herein. Further, the technique can be used to debug and correct the software job deck for those applications that ultimately make use of properly ordered overlay data.

Alignment attributes on the set-up reticle may be encoded, for example, to include the following: the placement error for each alignment attribute may be varied on the reticle; several pieces of the alignment attributes may be strategically missing; introducing an x-shift and a y-shift offset for each alignment attribute in a given field point; and the size of the patterned lines that make-up the alignment attributes may be varied in size depending on position on the reticle. The first encoding technique serves to detect the reading order within a set of measurements. The second encoding technique serves to identify the orientation of the wafer in reference to individual alignment attributes precisely aligned inside an exposure field. The third encoding technique allows a unique coordinate for every measured attribute inside a given field to be determined. The fourth encoding technique is used to ascertain if the overlay tool is reading centerline to centerline placement error as opposed to reading edge to edge shifts. By comparing the entire list of overlay tool output data on a point by point basis to the original encoded set-up reticle pattern, errors in the overlay tool software instructions may be identified and corrected. Using the techniques described below, a reticle or set-up reticle may be used to independently ascertain if an overlay job deck or program reads overlay data in the correct order. The set-up reticle is typically an encoded copy of a reticle or set of reticles that are used for photolithographic projection lens characterization An encoded reticle attachment for a photolithographic exposure machine that, when read on an overlay tool, gives a precise test at a multitude of field points of the data ordering produced by an overlay tool programmed to read a certain pattern and class of alignment attributes is described. One embodiment is directed towards a particular data flow problem where properly ordered data is needed from an optical overlay tool. In particular, this embodiment may simplify the task of debugging a job deck or overlay program used to control an overlay tool.

Figure 5A:
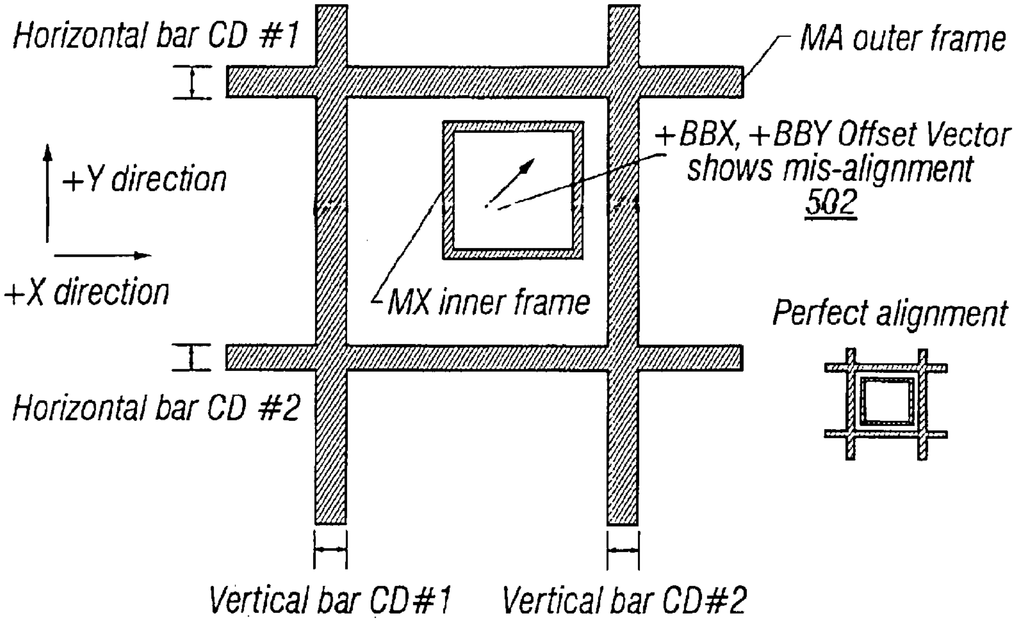
FIG. 5(*a*) is a schematic diagram showing sign convention for the encoded offsets BBX, BBY.
Figures 1, 2, 3, 4, 5B:
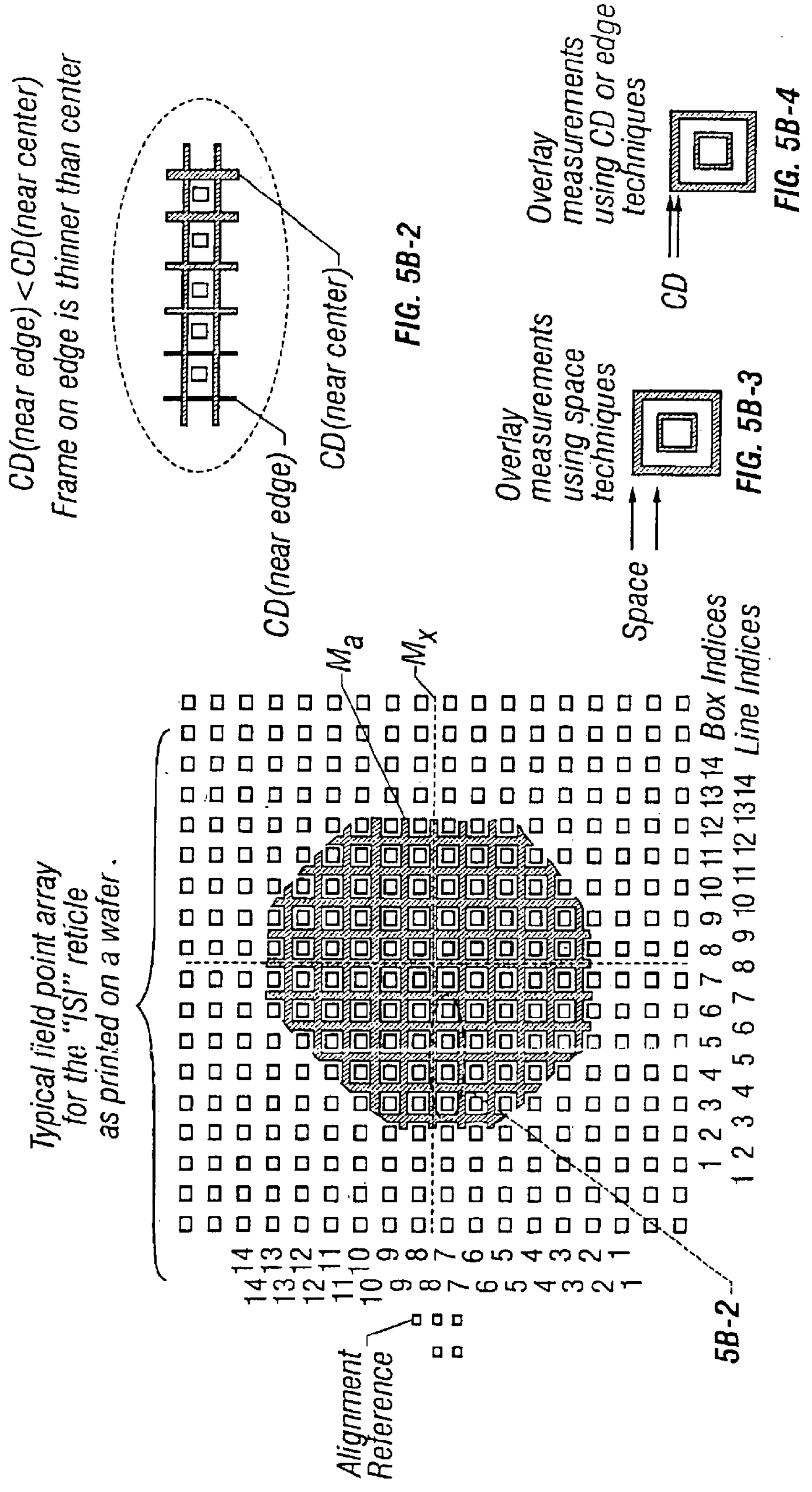
Figure 5C:
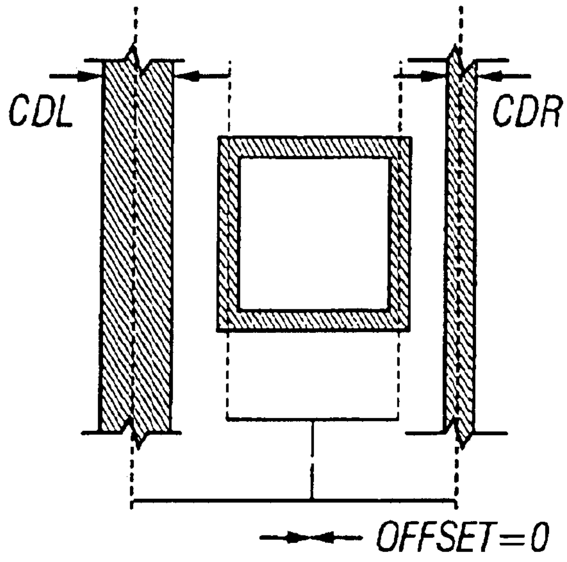
Figure 5D:
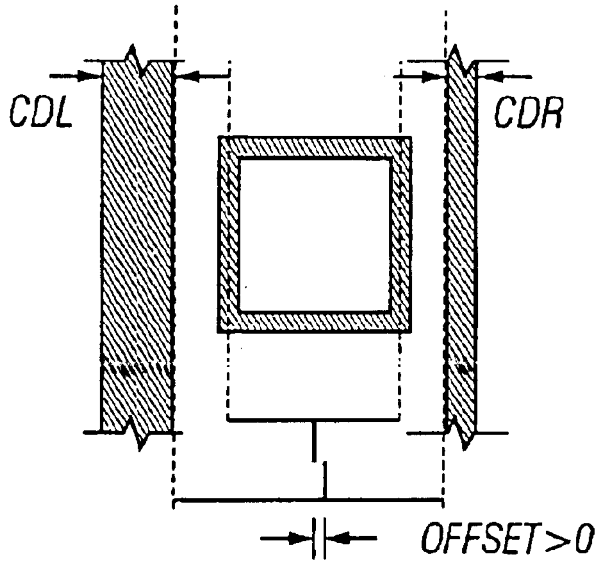

In U.S. Pat. Nos. 5,828,455 and 5,978,085 a method and apparatus for determining the shape of the emerging optical wavefront and the resulting aberrations for a photolithographic exposure tool using overlay measurements are described in detail. The technique requires printing a complex set of alignment attributes using a special "In-Situ Interferometer" (ISI) reticle and then measuring the registration errors using a conventional overlay tool. FIG. 2(*a*) shows a typical "ISI" reticle field point as printed on a wafer. The calculation that determines the shape of the wavefront depends in large part on the ability of the overlay tool to measure the alignment attributes in the correct order. For this application and several others this is not always a trivial matter.

Figure 14B:
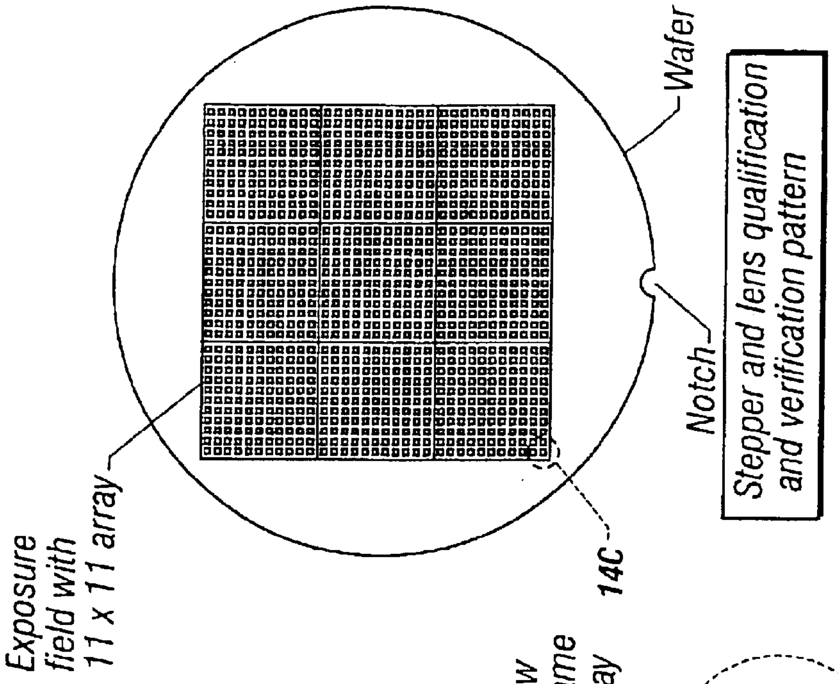
FIGS. 14(*a*)–14(*c*) are a schematic showing a prior art overlay exposure patterns for process monitoring and stepper qualification.
Figure 14C:
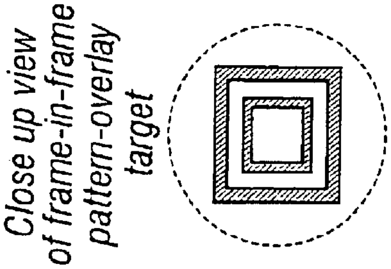
Figure 14A:
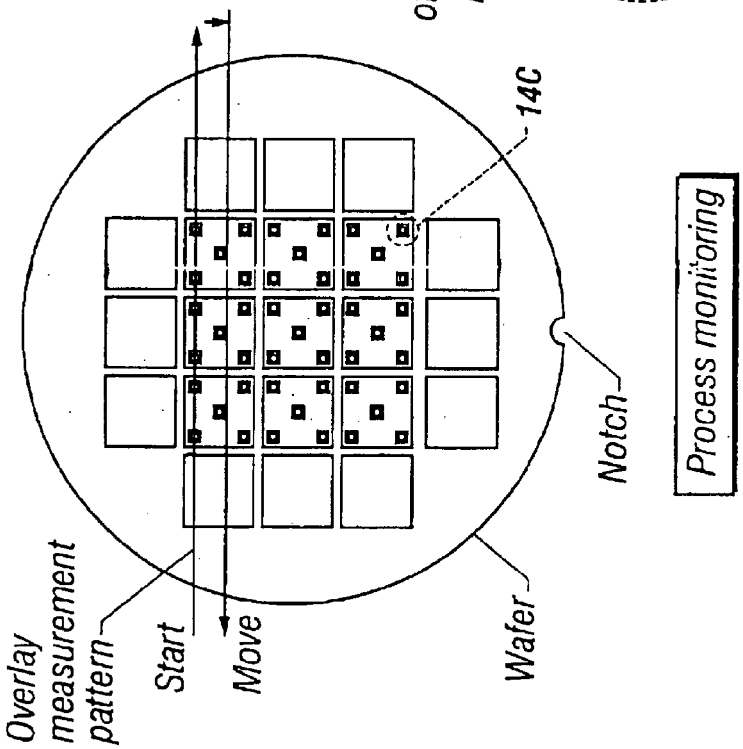
Figure 15A:
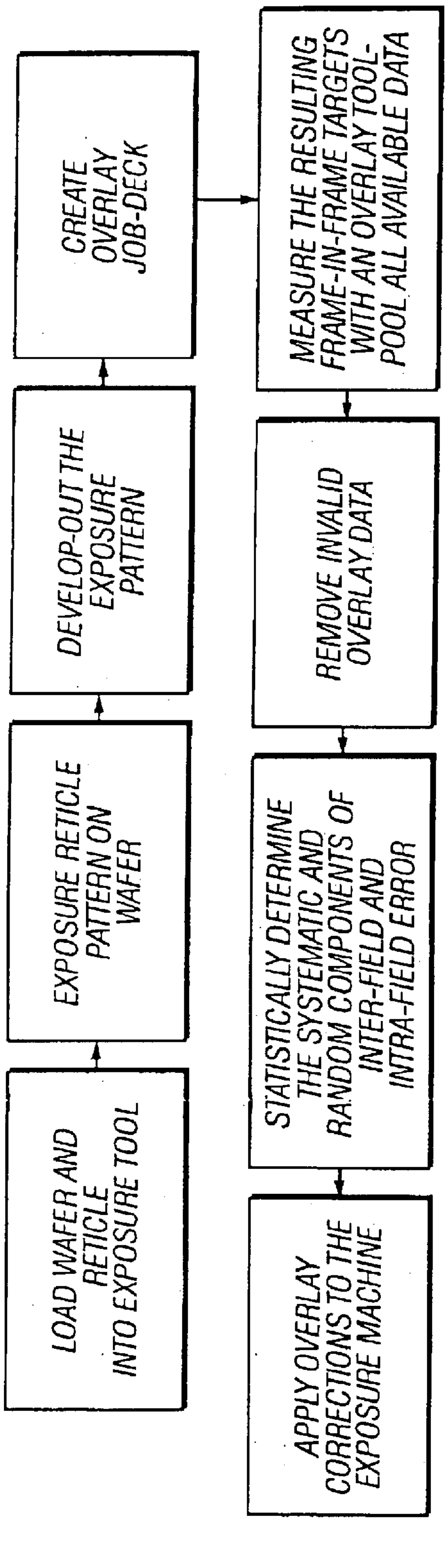
FIG. 15(*a*) is a flow chart of a prior art photolithographic tool set-up.
Figure 15B:
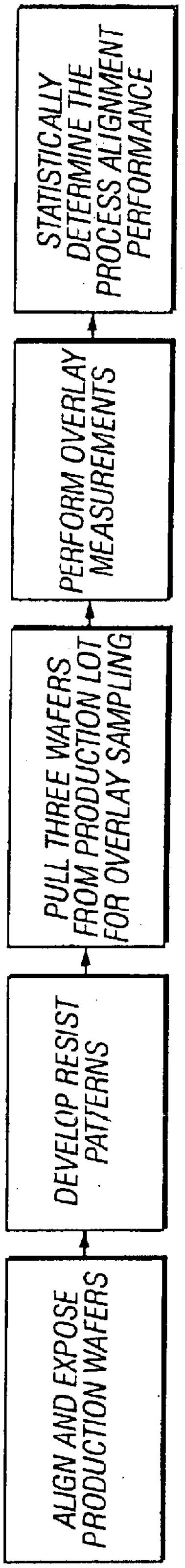
Figure 15C:
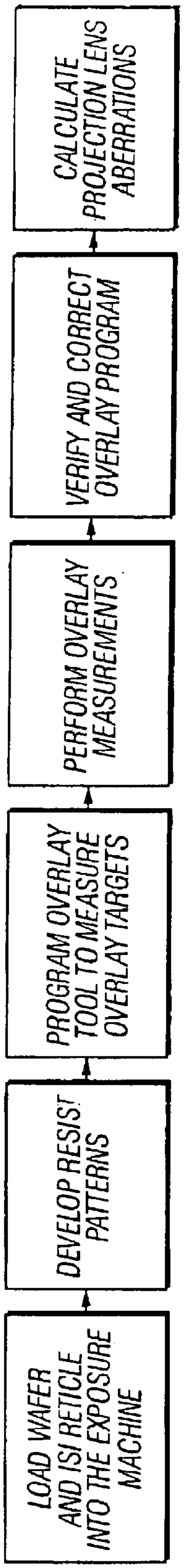

Conventional methods for collecting overlay data include programming an overlay tool with a set of software instructions that instruct the overlay tool to measure the alignment attributes or overlay targets in a distinct order, see for example FIGS. 14(*a*), 14(*b*), 14(*c*), 15(*a*), 15(*b*), and 15(*c*). The labeling and identification of the overlay output data usually depends on the type of overlay tool used to measure the alignment attributes. For example, the KLA 5100 series of tools use a complicated coding system that requires a fair degree of interpretation to decode the output data. See KLA 5105 overlay brochure, supra; KLA 5200 overlay brochure, supra. Other tools, like the BioRad Quaestor-Q7 simply label the output data by position, matching each registration error to its unique field point.

Most overlay tools are programmed to measure the alignment attributes in close proximity of many other similar looking features. Typically, overlay tools use an optical recognition routine to identify each alignment attribute just prior to measurement. Sometimes, the optical recognition system can read the wrong alignment attribute or a similar looking feature in a systematic way. If it is simply assumed that the overlay tool has identified the correct alignment attribute and one proceeds to use the program for production measurements, the data can become corrupt. In addition, many times the alignment attributes and wafer exposure patterns are symmetric with respect to the notch of the wafer, as illustrated in FIGS. 14(*a*), 14(*b*) and 14(*c*). The symmetry can cause confusion when trying to set-up and debug the overlay machine instructions to read the alignment attributes in a unique order. For most production applications, unorganized, missing and slightly corrupt overlay data can be accounted for. For example, most production overlay routines measure the alignment attributes wafer-to-wafer and use statistical techniques to determine the average amount of overlay error associated with the production lot as a whole, thus missing and unorganized overlay data is accounted for statistically. While averaging data reduces the effect of erroneously identified data points, averaging data is not desirable because it can reduce the accuracy of the result. It is therefore desirable to have a technique that can eliminate these errors.

While conventional techniques, such as those described in U.S. Pat. Nos. 5,828,455 and 5,978,085 can be used in the face of misordered data, the final results will generally suffer decreased accuracy. It therefore becomes very advantageous to have a method and or apparatus that can independently verify the integrity of the overlay set-up program, and output data results, before using the job deck program for production or development applications. Described below are apparatus and methods that can be utilized to ensure proper functioning for any photolithographic wafer inspection tools as well as in any printing situation where proper ordering of data is critical.

Figure 9:
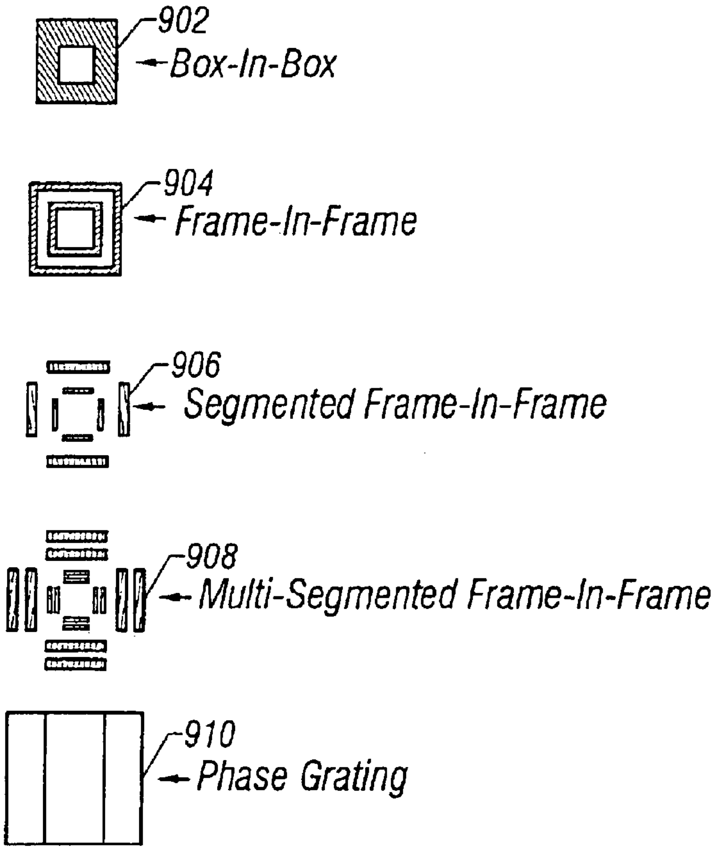
FIG. 9 is a block diagram showing typical overlay patterns or alignment attributes.

An illustration of the set-up reticle for one embodiment is shown in FIGS. 1(*a*), 1(*b*), and 1(*c*). The set-up reticle for the preferred embodiment is encoded in a special way using a variety of schemes described below. The reticle illustrated in FIG. 1(*a*) can be used to create and/or debug an overlay program using an encryption technique. It is also noteworthy that the alignment attributes, for example frame-in-frame structures, are imaged onto the wafer using one exposure. This is different as compared to typical overlay techniques that use a double exposure or alignment technique to form and measure the overlay targets as illustrated in FIG. 9. Thus instead of measuring the overlay error associated with the photolithographic exposure machine, only the overlay error associated with our encoded reticle with deviations, or built-in error, are measured in efforts to debug the job deck.

Figure 12:
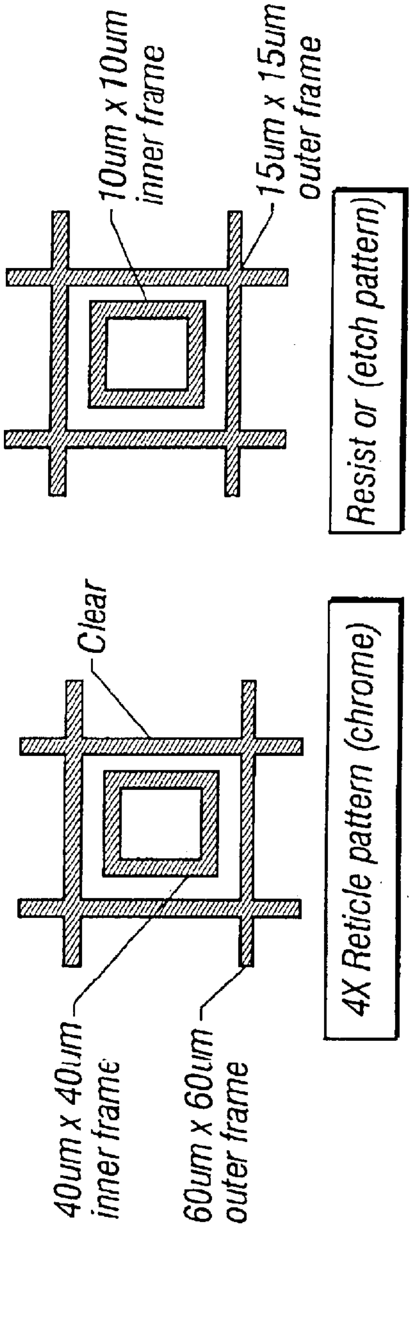
FIG. 12 is a schematic diagram showing a reticle and resist for frame-in-frame structures for one embodiment of the invention.
Figure 13:
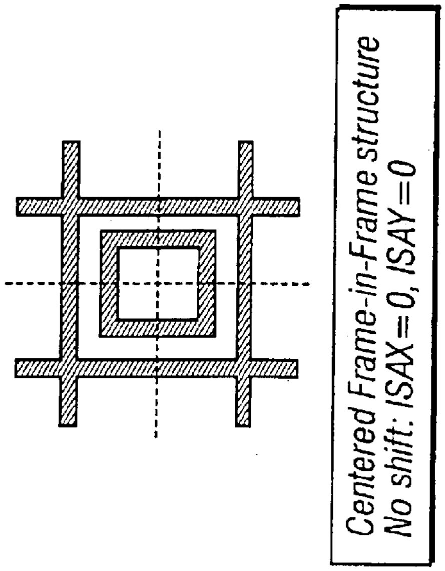
FIG. 13 is a schematic showing a perfectly centered frame-in-frame structure.

Because modem photolithographic exposure tools are capable of printing very small features (<0.2 microns) while the critical dimensions of the overlay targets are in the range of 2–4 microns; the rather small process induced overlay shifts are completely negligible as compared to the encoded shifts. A set-up reticle for this special application consists of a 10×12 group of field points on pitch P, each containing a 21×21 array of outer frame structures, and is illustrated in FIG. 1(*a*). The size and pitch of the alignment attributes can vary as illustrated in FIG. 2(*b*). In addition, the set-up reticle may contain a complete set of alignment attributes, such as frame-in-frame structures, in those areas where only a small circular patch (~0.4 mm) of the alignment attribute (frame-in-frame targets) is actually printed on the wafer as illustrated in FIG. 1(*c*), and FIG. 1(*e*). FIG. 12 shows a reticle and resist frame-in-frame description for a typical ISA coordinate site ISAX, ISAY. FIG. 13 shows a centered frame-in-frame structure. It should be noted that even though only a fairly generic version of an "ISI" reticle is described, there are many different "ISI" reticle designs, for example varying array sizes, etc.

Figure 3:
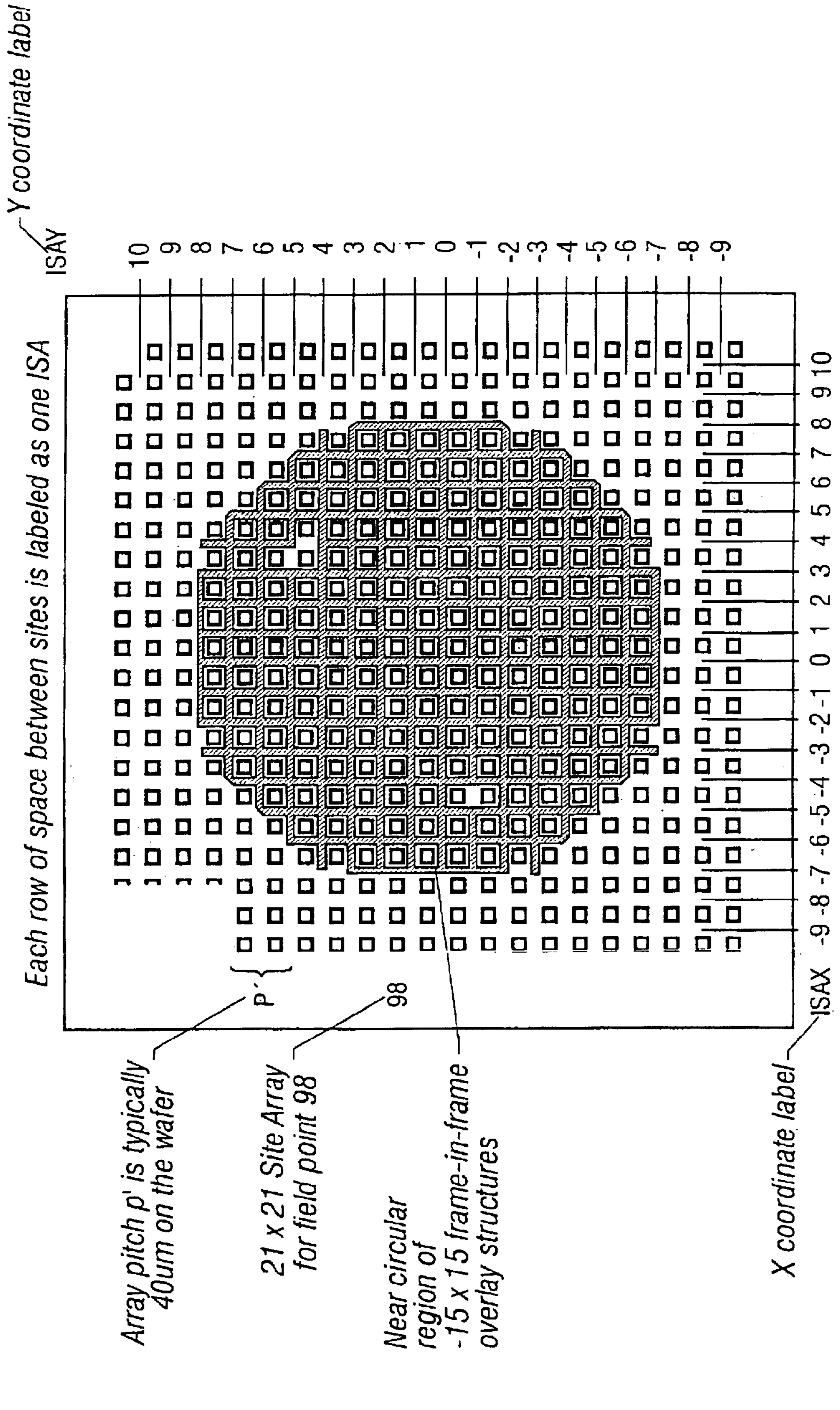
FIG. 3 is a schematic diagram that shows a diagram of ISA coordinates for a field point.

To assist in the following discussion two coordinate systems are described. FIG. 1(*a*) shows a technique of identifying field points on the set-up reticle. FIG. 1(*a*) illustrates a 10×12 array of field points each labeled from 1:120. In addition, each field point has an unique IXFP and IYFP coordinate number, ranging from IXFP 1:10, and IYFP 1:12, that locates the exact position on the reticle and on the wafer as illustrated in FIGS. 4(*a*) and 4(*b*). FIG. 3 shows the coordinate system for the 21×21 outer frame structures for a given field point, here, the alignment attributes are identified by assigning them an ISAX and ISAY coordinate (ranging from −9 to 10). A simpler outer frame identification system using IX and IY coordinates is shown in FIG. 7 (IX=1:21, IY=1:21). FIG. 8 shows an example of a table listing the location of (0,0) point of frame-in-frame data on a set-up reticle.

The alignment attributes on the set-up reticle may be encoded using different schemes to ensure the unambiguous ordering of resulting overlay data. For example, the setup reticle introduces a combination of missing features and known displacements to encode the pattern at each field point. Examples of four encoding schemes are described below to uniquely and independently verify if the overlay job deck or machine instructions are written correctly, however other encoding schemes are possible.

Encoding Scheme Example #1

Constant Field Point Encoding—Orientation

A first example of an encoding scheme designed to determine the orientation of the output overlay data in reference to the set-up reticle and wafer exposure pattern is illustrated in FIGS. 1(*d*) and 1(*e*). In this example, determining the orientation of the output overlay data is accomplished by removing a horizontal piece, or horizontal feature, creating a deviation of the alignment attributes located at the same position inside each field point array, see for example FIG. 6. These altered, or deviated, frame-in-frame structures are printed on the wafer, for example the process flow described in relation to FIG. 11.

Figure 11:
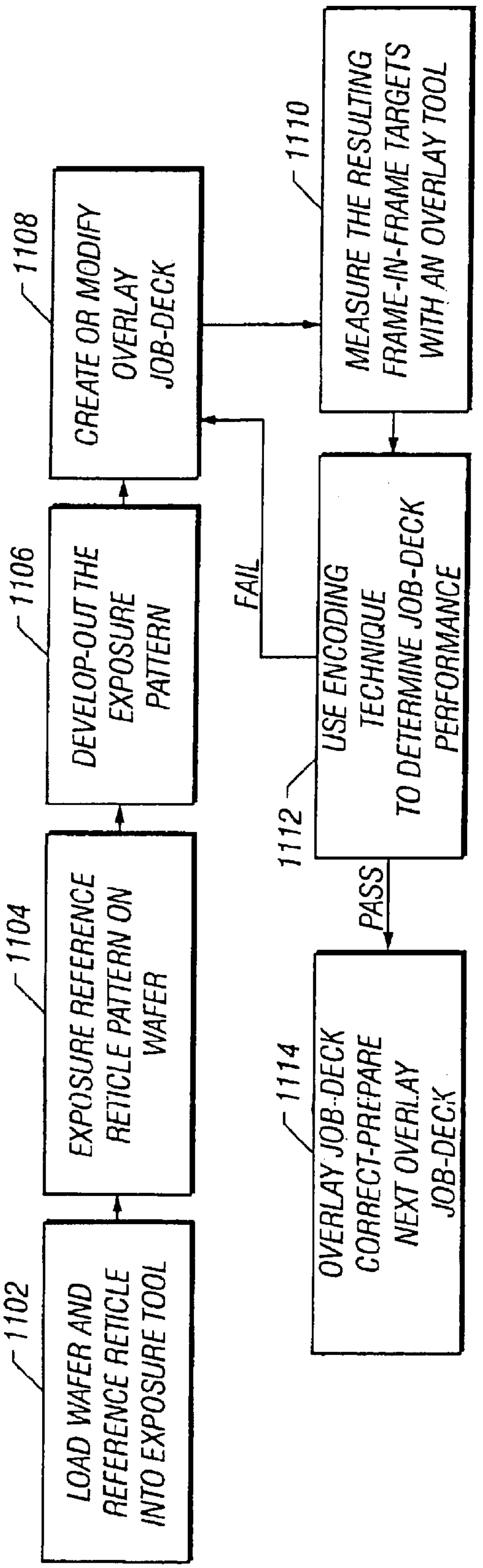
FIG. 11 is a flow chart of a method of verifying proper order of a job deck.

In FIG. 11 flow begins in block 1102 where a wafer and the reference reticle are loaded onto an exposure tool. Then, in block 1104, the reticle pattern is exposed onto the wafer. In block 1106 the wafer goes through an exposure process to develop-out the reticle pattern on the wafer. In block 1108 an overlay job-deck is created. Flow then continues to block 1110 where the alignment attributes, such as frame-in-frame targets, are measured with an overlay tool. In block 1112 the overlay measurements are examined to determine the location of the deviations, and thereby determine job-deck performance. If the job-deck performance is not satisfactory then flow continues to block 1108 where the job-deck is modified and a new set of measurements make in block 1110. If, in block 1112, it is determined that the job-deck performance is satisfactory then flow continues to block 114. In block 114 the next overlay-job-deck is prepared.

Because the alignment attributes, for example frame-in-frame structures, are damaged, or contain deviations (encoded), the overlay machine will output a null or bad measurement value for the deviated alignment attribute indicating it cannot find the feature. Hence, by locating the nulls in the data in the overlay output results it can be determined how the data is positioned relative to the wafer exposure pattern. In this scheme, the missing feature placement should not be symmetric with respect to rotation of the wafer.

Figure 6:
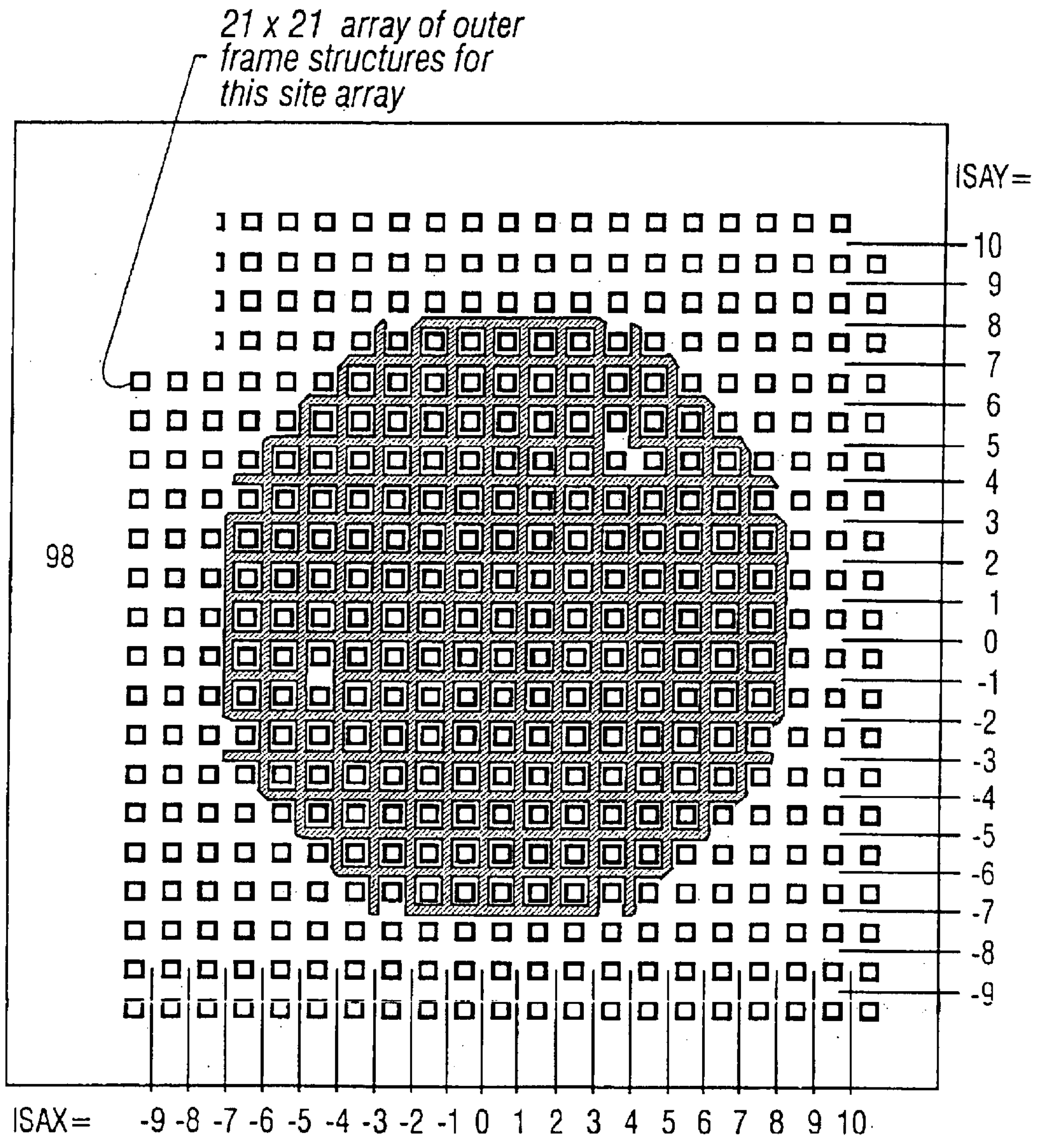
FIG. 6 is a schematic diagram showing the positions of the missing frame structures for field point 98 for two encoding schemes.

In the example just described, one piece or (one feature) of a frame-in-frame structure is omitted. This is a constant for all field points as shown in FIG. 6. Equation (1) gives the location of the missing horizontal piece of the frame-in-frame structure.

Location: ISAY=−1 and between ISAX =−4 and ISAX =−5 Eq.(1)

Where ISAX, ISAY are the ISA coordinates shown in FIG. 3.

Encoding Scheme Example #2

Variable Field Point Encoding—Field Point Identification

A second example of an encoding scheme involves removing one horizontal and one vertical piece of an alignment attribute, such as a frame-in-frame structure thus forming an "L" shaped pattern on the wafer as shown in FIG. 6. The location of the two missing pieces depends on the particular field point according to Equations (2) and (3) below. Again, the overlay machine will produce a null value for these alignment attributes and once they and the first encoding feature (missing bar in constant position) have been identified, it is possible to determine which field point within the 120 field point array the measurements were taken from.

Figure 4A:
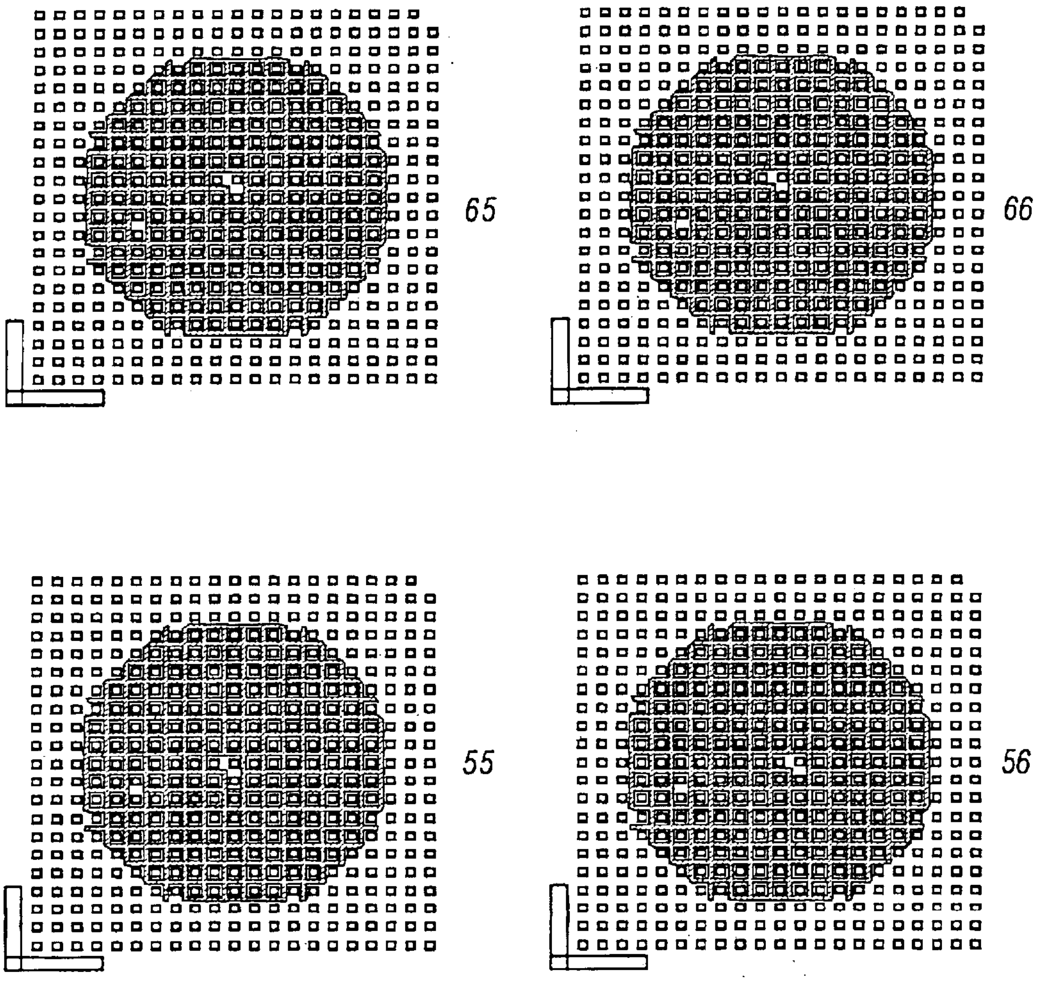
FIG. 4(*a*) is a schematic diagram showing several site arrays of field points.
Figure 4B:
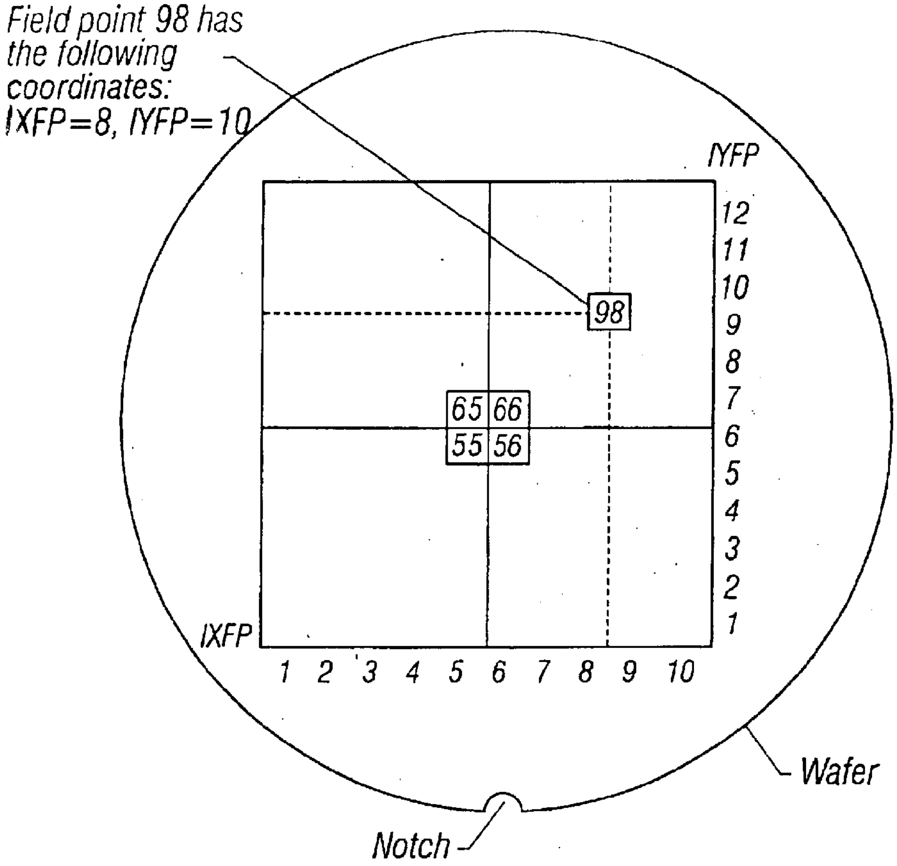

For this encoding example, each field point has a different missing a horizontal and vertical piece (or missing feature) from the frame-in-frame structures as shown in FIG. 6—according to Equations (2) and (3).

$$ISAX - IXFP - 5 \qquad \text{Eq. (2)}$$

$$ISAY = IYFP - 6 \qquad \text{Eq. (3)}$$

Where IXFP, IYFP is the field point coordinate (column, row) of the array and described in FIG. 4*b*, and ISAX and ISAY are the ISA coordinates shown in FIG. 3.

The vertical missing piece is at (Between ISAX and ISAX+1, ISAY).

The horizontal missing piece is at (ISAX, Between ISAY and ISAY+1).

Encoding Scheme Example #3

Offset Encoding—Array Point or Frame-in-Frame Identification

A third encoding example allows the identity of the unique ISAX and ISAY coordinate for every measured alignment attribute, for example frame-in-frame structure, inside any given field point to be determined. In this encoding scheme a mathematically derived x-shift and y-shift overlay offset for each frame-in-frame structure at a given field point is introduced according to Equations (4) and (5) below. Although the programmed offsets for each frame-in-frame structure are different there is one special frame-in-frame target for each field point. For example, field point 98 shown in FIG. 3 illustrates the case where there is one frame-in-frame structure called the field center or local origin that will have no encoded offset (BBx=BBy=0), it is located according to FIG. 8 at coordinates (IX,IY)=(14,15) in FIG. 7. A different field point, for example field point 41, will also have a unique field center, (IX,IY)=(7,8), however, it is located at a different coordinate position according to Equations (4) and (5) below. In effect, each field point has a unique origin for the location of the zero offset frame and frame structure and each frame-in-frame structure inside that field point has an offset that is a function of its distance from that origin as described in Equations (4) and (5). The modulated programmed offsets or stepping values used in Equations (4) and (5) are generally chosen to be large enough so lens distortion and processing variations have negligible effects on the overlay measurement. Because a typical overlay measurement for the ISI application is to be expected as 10–1000 nm at the wafer and we are using at least fifteen frame-in-frame structures across a given field point, a 10 nm step modulation would generally be sufficient. Typical overlay noise is less than 5 nm; hence, each step can be seen clearly. See KLA 5105 overlay brochure; KLA 5200 overlay brochure, supra.

$$BBX = a[IX - IXO] \qquad \text{eq. (4)}$$

$$BBY = a[IY - IYO] \qquad \text{eq. (5)}$$

where:

a=−0.01*[(ICOL−6)*10+5]/Mag (units=microns)

IXO=ICOL+6=X location of zero shift BBx

IYO=IROW+5=Y location of zero shift BBy

IX=x position of the alignment attribute site in question

IY=y position of the alignment attribute site in question

IROW=row number of the field point using the coordinate system in FIG. 4(*b*)

ICOL=column number of the field point using the coordinate system in FIG. 4(*b*)

Mag=Magnification of the photolithographic exposure tool (4× for example)

Encoding Scheme Example #4

Linewidth or CD Formula As Function Of ISA Coordinates

A fourth encoding scheme example can be used to monitor the performance of the overlay tool in regards to special photolithographic process induced effects that corrupt the overlay data in a unique way. Typically, a critical dimension (CD) diminution in an "egg crate" structure across each field point is observed, see for example FIGS. 5(*b*1), 5(*b*2), 5(*b*3) and 5(*b*4). If the overlay job deck does not account for these process induced CD variations the overlay tool might read incorrectly as it steps target to target across a given field point array. In particular, instead of measuring the offsets relative to the egg-crate centerline, we may be measuring it relative to the edges which when combined with the above-mentioned CD variation will lead to erroneous results. To identify and correct these problems the reticle pattern is deviated by forcing the CDs of the outer frame structures to decrease as a function of the position within the field point array according to equations (6) and (7), and illustrated in FIG. 5(*a*). For this encoding scheme the CDs of the horizontal and vertical bars that define the outer frame structure are modified, for example reduced, as a function of the position across the field point in ~10 nm steps.

The CD diminution effect usually shows up as the wrong result in the overlay data for those overlay tools/jobs that are sensitive to this particular CD variation, e.g. overlay jobs that have been incorrectly set up. Thus as illustrated in FIG. 5(*c*), an inner box is perfectly centered (offset=0) between two lines with different CD's when the overlay job is set up correctly to make a bar-in-bar type measurement. While in FIG. 5*d*, the same alignment attribute will now produce a non-zero offset when set up (incorrectly) as a bar-in-box measurement. FIGS. 5(*b*1), 5(*b*2), 5(*b*3) and 5(*b*4) further illustrate this diminution error and how it might introduce overlay noise. For the example of frame-in-frame structures, an overlay tool or job deck that is not sensitive to these CD variations will measure only the programmed offsets from encoding scheme Example (3) described above and illustrated in FIGS. 5(*a*) and 5(*b*1), 5(*b*2), 5(*b*3) and 5(*b*4). Therefore, if the overlay tool produces incorrect measurements in a pattern that matches our fourth encoding scheme the overlay job deck will have to be modified to account for the diminution effect.

Finally, the fourth encoding scheme could also be used as a CD analog of the third encoding scheme for those overlay tools that can be programmed to measure the CD as a function of position across a field point.

The linewidth, or CD, for the outer frame (overlay target) increases in width across any given field point according to Equations (6) and (7)—see FIG. 5(*a*) for examples.

$$\text{Horizontal Linewidth or CD} = 16.0 + 0.2^{*}\ \text{Round}(0.5^{*}\ ISAY) \qquad \text{Eq. (6)}$$

$$\text{Vertical Linewidth or CD} = 16.0 + 0.2^{*}\ \text{Round}(0.5^{*}\ ISAX) \qquad \text{Eq. (7)}$$

Where ISAX, ISAY are the ISA coordinates as shown in FIG. 3.

Reticle fabrication

Table 1 (shown below) gives a set of example for details for creating a set-up reticle.

TABLE 1

SETUP RETICLE DESCRIPTION

1: Reticle fabrication details
TOOL COORDINATES, UNITS = MM AT RETICLE THROUGHOUT

| | |
|---|---|
| MODEL NUMBER = | ISETU4 |
| LITEL METROLOGY TOOL SERIAL NUMBER = | ISETU4-0600T0001 |
| TOOL TYPE = | ISI SETUP RETICLE |
| TOOL DESCRIPTION = | NARROW FIELD #2 |

TABLE 1-continued

SETUP RETICLE DESCRIPTION

1: Reticle fabrication details
TOOL COORDINATES, UNITS = MM AT RETICLE THROUGHOUT

| | |
|---|---|
| XLLC, YLLC = X, Y LOWER LEFT FIELD POINT POS. = | −45.0 −55.0 |
| XPITCH = X SPACING OF FIELD POINTS (MM) = | 10.0 |
| YPITCH = Y SPACING OF FIELD POINTS (MM) = | 10.0 |
| Z_LW = MA LINEWIDTH AT RETICLE = | VARIABLE [16 EA. + BIAS TERM] |
| NFX = # OF FIELD POINTS ACROSS X DIRECTION = | 10 |
| NFY = # OF FIELD POINTS ACROSS Y DIRECTION = | 12 |
| PITCH_MA = MA LINE SPACING OR PITCH = | 0.106 (LINES) |
| ALIGNMENT MARKS = | ASML 4X, CANON 4X AND 5X, NIKON4X, SVGMSIIII |
| EXCEL WORKBOOK DESCRIBING PATTERNS ON RETICLE = | ISETU4-0600T0001.XLS |
| RADIUS OF NA CIRCLE ON RETICLE (MM) = | 0.8 |

BIAS TERM = .2 × ROUND [.5 × |ISAY|] HORIZ.
= .2 × ROUND [.5 × |ISAX|] VERT.

The four examples of encoding schemes may be used together to ensure data ordering and job deck integrity. For example, a set-up reticle may print an array of field points—each containing an array of alignment attributes—simultaneously within a given exposure field, see FIG. 1(*d*). A number of field point arrays within this exposure field are measured using a commercially available overlay tool. The constant positioned missing feature is used to compare the orientation of the wafer to the job file. The variable positioned missing features are used to compare the field point assignments. The variable positioned overlay target displacement values are used within each field point array to ensure each position is being measured in correct order and is correctly assigned. Examining the periphery of the field point array checks the overall centering of the overlay tool on the arrays. Sensitivity to CD variations shows up directly in overlay measurements. Any anomalies are observed in the form of CD measurements or overlay measurements out of assigned values for the setup reticle. The job files for the reader, or mechanical/optical adjustments, are then altered.

This iterative process continues until all data is correctly read. Any revision to the job files/tool parameters that read patterns differently goes through the same process. And since the instruction set or job deck for overlay tools are a function of the particular overlay pattern, the encoding can be adjusted for any pattern of interest. Although the preferred embodiment has been described in detail for a particular overlay job, the techniques described can be used for any overlay job requiring independent validation of results by creating a copy of the reticle in question and encoding the alignment attributes using the techniques described above.

In another embodiment, a product or test reticle may be modified by adding encoded alignment attributes at strategic sites very close to the alignment attributes that need to be verified. This may be desirable, for example, if a separate set-up reticle becomes to expensive. Using the modified reticle, a reticle pattern may be printed and the overlay job debugged as described above. Later, the user can rewrite the machine code using small positional offsets to create the final production worthy overlay job. Although this technique does not guarantee that the final overlay job is correct, it does verify that a proper job deck or program can be created. In addition, other embodiments of the set-up reticle may include adding features on production reticles to assist in setting up the overlay tool.

In a semiconductor process application where the ordered reading of critical dimension (CD) data is required, one can create a set-up reticle that uses a CD encoding scheme similar to the techniques described above. For example, a set-up reticle can be created that encodes CD variations and missing feature patterns according to the encoding scheme examples listed above. The CD set-up reticle may then be printed on resist coated wafers and measured on an overlay tool or CD SEM to determine if the job deck or machine program is written correctly, thereby extending the technique described to include CD-SEM metrology.

Figure 10:
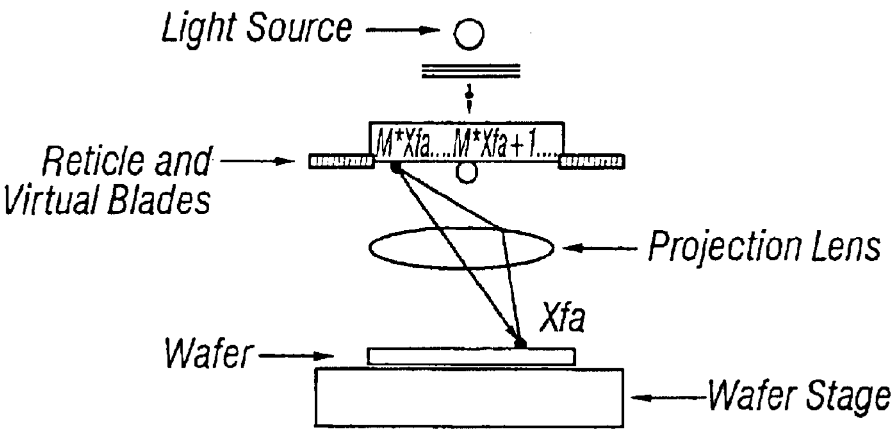
FIG. 10 is a block diagram showing a typical photolithographic stepper or scanner system.

The reticle plate of one embodiment is shown in FIG. 1(*a*). There are no strict requirements on the size of the reticle plate, the shape of the overlay target patterns, or the types of materials used to fabricate the mask plate. Many different overlay target patterns are available. The technique described will work with any photolithographic exposure tool using any type of alignment attributes, including known ASML, Nikon, Canon, and SVGL branded machines. Examples of photolithographic projection systems that the technique can be used on include photolithographic stepper or scanner systems as shown in FIG. 10, electron beam imaging systems, direct write tools, scapula tools, extreme ultra-violet photolithographic tools, and x-ray imaging systems.

The techniques described above can also be used for debugging the job deck or machine code for in-situ applications, where the overlay and/or CD metrology is performed inside the photolithographic exposure machine.

The foregoing description details certain embodiments of the invention. It will be appreciated, however, that no matter how detailed the foregoing appears, the invention may be embodied in other specific forms without departing from its spirit or essential characteristics. The described embodiments are to be considered in all respects only as illustrative and not restrictive and the scope of the invention is, therefore, indicated by the appended claims rather than by the foregoing description. All changes which come with the meaning and range of equivalency of the claims are to be embraced within their scope.

We claim:

1. A reticle for use in a photolithographic projection system, the reticle comprising a pattern of alignment attributes with known deviations in the pattern encoded onto the reticle wherein the known deviations are imaged in predetermined locations on an exposed recording media and appear in a predetermined order when the projection system is operated in accordance with a properly ordered job deck, the deviations include placement errors in the pattern of alignment attributes, wherein the placement errors include a removed portion of an attribute, located at the same position of the pattern of alignment attributes, inside each field point array.

2. A reticle as defined in claim 1, wherein the removed portion of the pattern is asymmetric with respect to rotation of the pattern.

3. A reticle as defined in claim 1, wherein the deviations include removal of two adjacent portions of an attribute that are orthogonal to each other.

4. A reticle as defined in claim 3, wherein the two adjacent portions of the attribute form an L shape.

5. A reticle as defined in claim 1, wherein the deviations include x-shift offsets in the pattern.

6. A reticle as defined in claim 1, wherein the deviations include y-shift offsets in the pattern.

7. A reticle as defined in claim 1, wherein line widths of the attributes are varied as a function of their location in the pattern.

8. A reticle as defined in claim 1, wherein the projection system is a photolithographic stepper.

9. A reticle as defined in claim 1, wherein the projection system is a photolithographic scanner.

10. A reticle as defined in claim 1, wherein the projection system is an electron beam imaging system.

11. A reticle as defined in claim 1, wherein the projection system is a direct write tool.

12. A reticle as defined in claim 1, wherein the projection system is an extreme ultra-violet photolithographic tool.

13. A reticle as defined in claim 1, wherein the projection system is an x-ray imaging system.

14. A reticle as defined in claim 1, wherein the projection system is a scapula tool.

15. A reticle for use in a photolithographic projection system, the reticle comprising a pattern of alignment attributes with known deviations in the pattern encoded onto the reticle, wherein the known deviations are imaged in predetermined locations on an exposed recording media and appear in a predetermined order when the projection system is operated in accordance with a properly ordered job deck and the deviations include placement errors in the pattern of alignment attributes, wherein the placement errors include a removed portion of an attribute located at the same position of the pattern of alignment attributes inside each field point array and the removed portion of the pattern is asymmetric with respect to rotation of the pattern, wherein the removed portion includes removal of two adjacent portions of an attribute that are orthogonal to each other such that the two adjacent portions of the attribute form an L shape, wherein the deviations include x-shift offsets and y-shift offset in the pattern, and wherein line widths of the attributes are varied as a function of their location in the pattern.

16. A reticle as defined in claim 15, wherein the projection system is a photolithographic stepper.

17. A reticle as defined in claim 15, wherein the projection system is a photolithographic scanner.

18. A reticle as defined in claim 15, wherein the projection system is an electron beam imaging system.

19. A reticle as defined in claim 15, wherein the projection system is a direct write tool.

20. A reticle as defined in claim 15, wherein the projection system is an extreme ultra-violet photolithographic tool.

21. A reticle as defined in claim 15, wherein the projection system is an x-ray imaging system.

22. A reticle as defined in claim 15, wherein the projection system is a scapula tool.

23. A reticle for use in a photolithographic projection system, the reticle comprising a pattern of alignment attributes with known deviations in the pattern encoded onto the reticle wherein the known deviations are imaged in predetermined locations on an exposed recording media and appear in a predetermined order when the projection system is operated in accordance with an ordered job deck, wherein location of the deviations within the pattern determine if the job deck is in a proper order.

24. A reticle as defined in claim 23, wherein the deviations include placement errors in the pattern of alignment attributes.

25. A reticle as defined in claim 24, wherein the placement errors include an added portion of an attribute, located at the same position of the pattern of alignment attributes, inside each field point array.

26. A reticle as defined in claim 25, wherein the added portion of the pattern is asymmetric with respect to rotation of the pattern.

27. A reticle as defined in claim 24, wherein the deviations include addition of two adjacent portions of an attribute that are orthogonal to each other.

28. A reticle as defined in claim 27, wherein the two adjacent portions of the attribute form an L shape.

29. A reticle as defined in claim 24, wherein the placement errors include removal of a portion of an attribute, located at the same position of the pattern of alignment attributes, inside each field point array.

30. A reticle as defined in claim 29, wherein the removed portion of the pattern is asymmetric with respect to rotation of the pattern.

31. A reticle as defined in claim 29, wherein the placement errors include removal of two adjacent portions of an attribute that are orthogonal to each other.

32. A reticle as defined in claim 31, wherein the two adjacent portions of the attribute form an L shape.

33. A reticle as defined in claim 23, wherein the deviations include x-shift offsets in the pattern.

34. A reticle as defined in claim 23, wherein the deviations include y-shift offsets in the pattern.

35. A reticle as defined in claim 23, wherein line widths of the attributes are varied as a function of their location in the pattern.

* * * * *